United States Patent
Weir et al.

(10) Patent No.: US 8,995,041 B2
(45) Date of Patent: Mar. 31, 2015

(54) TERNARY NICKEL OXIDE MATERIALS FOR ELECTROCHROMIC DEVICES

(71) Applicants: SAGE Electrochromics, Inc., Faribault, MN (US); National Renewable Energy Laboratory, Golden, CO (US)

(72) Inventors: Douglas Glenn John Weir, Northfield, MN (US); Feng Lin, Fujian (CN); Chaiwat Engtrakul, Louisville, CO (US)

(73) Assignees: SAGE Electrochromics, Inc., Faribault, MN (US); Alliance For Sustainable Energy, LLC, Golden, CO (US)

( * ) Notice: Subject to any disclaimer, the term of this patent is extended or adjusted under 35 U.S.C. 154(b) by 0 days.

(21) Appl. No.: 13/961,184

(22) Filed: Aug. 7, 2013

(65) Prior Publication Data

US 2014/0043666 A1 Feb. 13, 2014

Related U.S. Application Data

(60) Provisional application No. 61/776,886, filed on Mar. 12, 2013, provisional application No. 61/681,353, filed on Aug. 9, 2012.

(51) Int. Cl.
*G02F 1/155* (2006.01)
*C23C 14/08* (2006.01)
*G02F 1/15* (2006.01)
(Continued)

(52) U.S. Cl.
CPC .............. *G02F 1/155* (2013.01); *C23C 14/08* (2013.01); *G02F 1/1523* (2013.01); *C23C 14/3414* (2013.01); *C23C 14/3464* (2013.01); *H01M 4/0426* (2013.01); *H01M 4/505* (2013.01); *H01M 4/525* (2013.01);
(Continued)

(58) Field of Classification Search
CPC .................. G02F 1/155; G02F 1/1523; G02F 2001/1502; G02F 2001/1555; C23C 14/08; C23C 14/3414; H01M 4/0426; H01M 4/505; H01M 4/525; H01M 4/005
USPC .......................... 359/265; 204/192.1; 252/583
See application file for complete search history.

(56) References Cited

U.S. PATENT DOCUMENTS 5,699,192 A 12/1997 Van Dine et al.
6,094,292 A 7/2000 Goldner et al.
(Continued)

FOREIGN PATENT DOCUMENTS

WO 2009029111 A1 3/2009

OTHER PUBLICATIONS

Dane Gillaspie et al: "Nanocomposite Counter Electrode Materials for Electrochromic Windows", Journal of the Electrochemical Society, vol. 157, No. 3, Jan. 20, 2010, pp. H328-H331, XP055095795.
(Continued)

*Primary Examiner* — David N Spector
(74) *Attorney, Agent, or Firm* — Robert N. Young

(57) ABSTRACT

Compounds having the formula $Li_aEC_1M1_bM2_cO_x$, wherein "a" ranges from about 0.5 to about 3; b+c ranges from about 0.1 to about 1; c/(b+c) ranges from about 0.1 to about 0.9; and wherein x is about 0.1 to about 50, are disclosed. Methods of making these compounds as well as their use in thin film materials and electrochromic devices are also disclosed.

20 Claims, 3 Drawing Sheets

LiNiZrVO$_x$ (~80 nm, CV, 50$^{th}$ cycle)

(51) Int. Cl.
*C23C 14/34* (2006.01)
*H01M 4/04* (2006.01)
*H01M 4/505* (2010.01)
*H01M 4/525* (2010.01)
*H01M 14/00* (2006.01)

(52) U.S. Cl.
CPC .... *H01M 14/005* (2013.01); *G02F 2001/1502* (2013.01); *G02F 2001/1555* (2013.01); *Y02E 60/122* (2013.01)
USPC .......................... 359/265; 252/583; 204/192.1

(56) References Cited

U.S. PATENT DOCUMENTS

| | | | |
|---|---|---|---|
| 6,277,532 | B1 | 8/2001 | Yahiro |
| 6,859,297 | B2 | 2/2005 | Lee et al. |
| 2004/0150867 | A1 | 8/2004 | Lee et al. |
| 2004/0155263 | A1 | 8/2004 | Giron |
| 2006/0028730 | A1 | 2/2006 | V. Varaprasad et al. |
| 2009/0057137 | A1 | 3/2009 | Pitts et al. |
| 2011/0151283 | A1 | 6/2011 | Gillaspie et al. |
| 2014/0016173 | A1* | 1/2014 | Gillaspie et al. ............. 359/265 |

OTHER PUBLICATIONS

Dane T. Gillaspie et al: 'Metal-oxide films for electrochromic applications: present technology and future directions', Journal of Materials Chemistry, vol. 20, No. 43, Jan. 10, 2010, pp. 9585-9592, XP055095800.
International Search Report and Written Opinion for Application No. PCT/US2013/053934 dated Apr. 23, 2014.
Kenji Tateishi et al: 'LiMn2O4: a spinel-related low-temperature modification', Acta Crystallographica Section E Structure Reports Online, vol. 60, No. 2, Jan. 17, 2004, pp. i18-i21, XP055096067.
Lim s et al: "PVP-Assisted ZrO2 coating on LiMn2O4 spinel cathode nanoparticles prepared by MnO2 nanowire templates", Electrochemistry Communications, Elsevier, Amsterdam, NL, vol. 10, No. 10, Oct. 1, 2008, pp. 1478-1481, XP025467154.
P. M. S. Monk, R. J. Mortimer, D. R. Rosseinsky: "Electrochromism: Fundamentals and Applications", 1995, VCH, Federal Republic of Germany, XP002718689, pp. 78-91.
Paul M. S. Monk et al: 'Electrochromic tungsten oxide: doping with two or three other metal oxides', Journal of Materials Chemistry, vol. 4, No. 7, 1994, pp. 1071-1074, XP055095387.
C. Pouillerie et al.: "Effect of magnesium substitution on the cycling behavior of lithium nickel cobalt oxide", Journal of Power Sources, vol. 96, 2001, pp. 293-302.
European Search Report for Application No. EP 06003692 dated May 9, 2002.
International Search Report for Application No. PCT/US2012/047569 dated Sep. 19, 2012.
J. Kim, K. Amine: "A comparative study on the substitution of divalent, trivalent and tetravalent metal ions in LiNi1-xMxO2 (M=Cu2+, Al3+ and Ti4+)", Journal of Power Sources, vol. 104, 2002, pp. 33-39.
J.B. Wu et .al.: "Analysis of AC electrical properties of (Li and Ti)-doped NiO", Materials Science and Engineering B, vol. 99, 2003, pp. 294-297.
Kaufman, H.R. et al., Sputtering, J. Vac. Sci. Techn. 21, 725 (1982).
Lee et al., "A new lithium based counter electrochromic material for fast optical reponse", Proceedings of the third symposium on Electrochromic Materials, vol. 96-24, 1997, pp. 191-205.
Lee S-H et al: "Characterization of Ni—W oxide thin film electrodes" Solid State Ionics, North Holland Pub. Company. Amsterdam, NL, vol. 109, No. 3-4, Jun. 2, 1998, pp. 303-310.
Lee S-H et al: "Raman spectroscopic studies of Ni—W oxide thin films" Solid State Ionics, North Holland Pub. Company. Amsterdam, NL, vol. 140, No. 1-2, Mar. 1, 2001, pp. 135-139.
Lee, S.-H. et al., "Electrochromic behavior of Ni—W oxide electrodes," Solar energy Materials and Solar Cells 39 (1995) 155-166.
Lee, Se-Hee et al., "Electrochromic mechanism in a-WO3-y thin films," Applied Physics Letters, American Institute of Physics (Jan. 11, 1999), pp. 242-244.
Passerini S et al: "The Intercalation of Lithium in Nickel Oxide and Its Electrochromic Properties" Journal of the Electrochemical Society, Electrochemical Society. Manchester, New Hampshire, US, vol. 137, No. 10, Oct. 1, 1990, pp. 3297-3300.
Scrosati, "1st International Meeting on Electrochromism (IME-1), Murano-Venice, Oct. 19-21, 1994", Solar Energy Materials and Solar Cells, 1995.
Svegl F et al: "Electrochromic properties of lithiated Co-oxide (LixCoO2) and Ni—oxide (LixNiO2) thin films prepared by the sol-gel route", Solar Energy. Pergamon Press. Oxford, GB, vol. 68, No. 6, Jan. 1, 2000, pp. 523-540.
Yan Dong et .al.: "Microstructure and dielectric properties of LiTiNiO thin films", Key Engineering Materials, vol. 336-338, 2007, pp. 2635-2638.
Z. Lu, J.R. Dahn: "Understanding the anomalous capacity of Li/Li[NixLi(1/3-2x/3)Mn(2/3-x/3)]O2 cells using in situ X-ray diffraction and electrochemical studies", Journal of the Electrochemical Society, vol. 149, 2002, pp. A815-A822.

\* cited by examiner

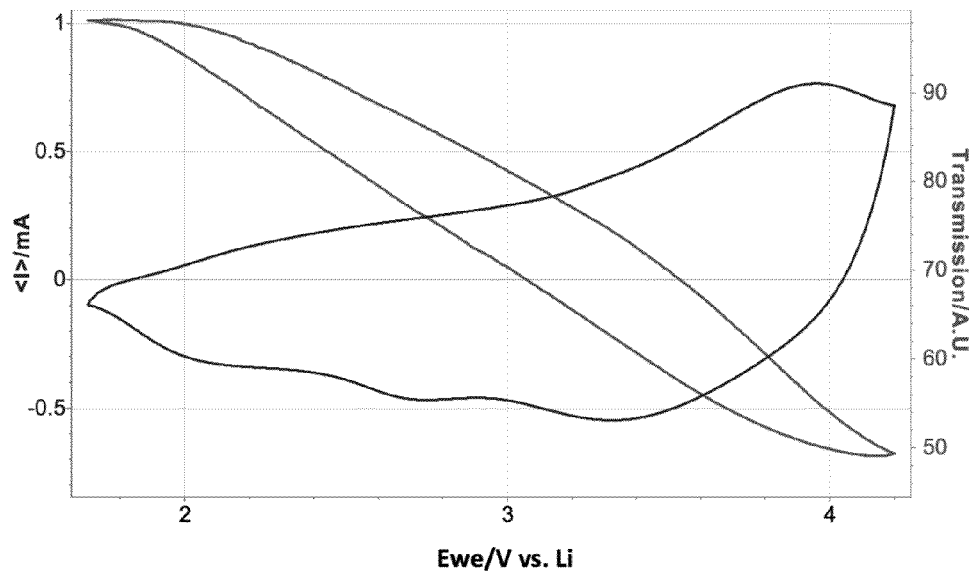
Figure 1 LiNiZrVO$_x$ (~80 nm, CV, 50$^{th}$ cycle)
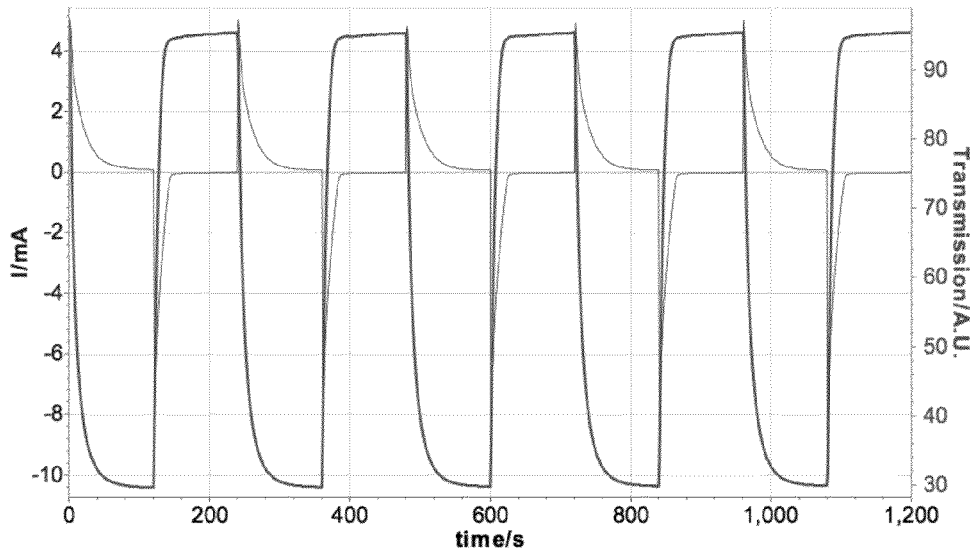
Figure 2 LiNiZrVO$_x$ (~200 nm, CA, after 500 CV cycles)

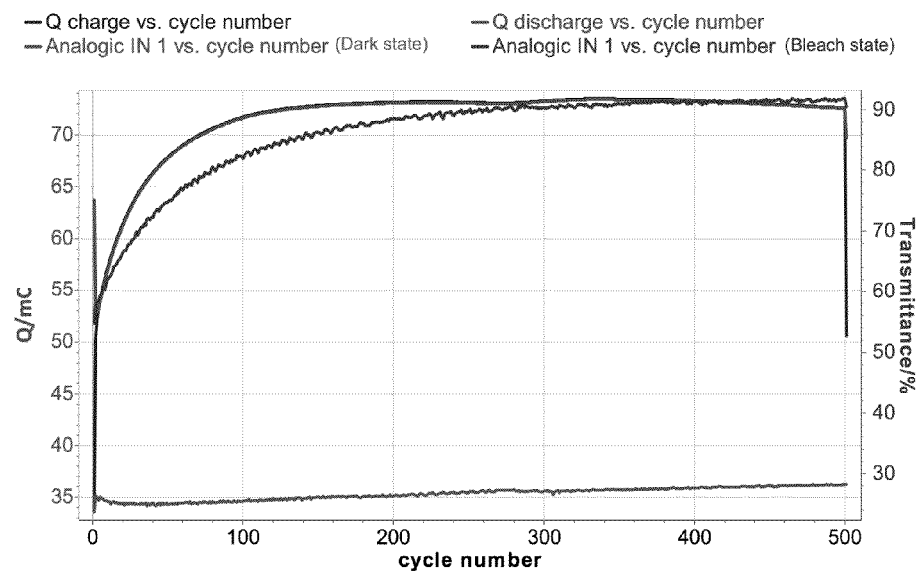
Figure 3 LiNiZrVO$_x$ (~200 nm, charge capacity and transmission from CV)

TERNARY NICKEL OXIDE MATERIALS FOR ELECTROCHROMIC DEVICES

CROSS-REFERENCES

The present application claims the benefit of the filing dates of U.S. Provisional Patent Application Nos. 61/681,353 filed Aug. 9, 2012 and 61/776,886 filed Mar. 12, 2013, the disclosures of which are hereby incorporated herein by reference.

CONTRACTUAL ORIGIN

This invention was made under CRADA CRD-06-203 between Sage Electrochromics, Inc. and the National Renewable Energy Laboratory. The Government has certain rights in this invention.

BACKGROUND OF THE INVENTION

The optical transmission and/or optical reflectivity of electrochromic coatings can be varied repeatedly and reversibly between low and high transmission states, and/or between low and high reflectivity, by applying an electrical potential between the top surface and bottom surface of the electrochromic coating. In the specialized application to architectural windows, or windows comprising the exterior envelopes of buildings, electrochromic coatings on the window glass can be used to control the amount of sunlight and/or solar heat that enters the building. This control can extend from ultraviolet wavelengths into the infrared, to modulate the entire solar spectrum of sunlight that typically reaches habitable buildings.

In particular, high performance electrochromic coatings must withstand the harsh conditions of intense sunlight and wide variation in temperature that are typically endured by architectural windows, while retaining their ability to cycle between low transmission and high transmission modes, without any degradation in the color or level of transmission for either the low or high transmission mode, over the course of a suitable long service life, say 20 years or about 20,000 cycles between modes.

However, these optical coatings need not be impervious to moisture because they can be isolated from moist air by encapsulating them within a hermetically sealed, double pane, insulating window, where the electrochromic coating resides on one of the interior surfaces of the insulating window, and are only exposed to dry air or inert fill gas.

A specialized subset of electrochromic coatings that is believed to satisfy the service requirements of architectural windows, described above, consists entirely of inorganic metal oxides and nitrides, completely devoid of any carbon containing polymeric materials or silicones. Typically, these coatings make use of ion insertion compounds that can change between low and high (or high and low) optical transmission, over a wide wavelength range. Cathodic materials darken from high to low optical transmission when they are electrochemically reduced—by supplying them with electrons and charge balancing positive ions at a low, reducing electrical potential. Anodic materials darken when they are electrochemically oxidized—by depleting them of electrons and charge balancing positive ions at a high, oxidizing electrical potential.

SUMMARY OF THE INVENTION

In one aspect of the present invention is the compound $Li_{1.82}NiW_{0.45}O_x$, where x is an integer ranging from about 0.1 to about 50. In some embodiments, x ranges from about 1 to about 6. In other embodiments, x ranges from about 1.6 to about 5.4.

In another aspect of the present invention is the compound $Li_{1.97}NiZr_{0.23}O_x$, where x is an integer ranging from about 0.1 to about 50. In some embodiments, x ranges from about 1 to about 6. In other embodiments, x ranges from about 1.6 to about 5.4.

In another aspect of the present invention is the compound $Li_{0.51}NiZr_{0.16}La_{0.19}O_x$, where x is an integer ranging from about 0.1 to about 50. In some embodiments, x ranges from about 1 to about 6. In other embodiments, x ranges from about 1.6 to about 5.4.

In another aspect of the present invention is the compound $Li_{2.22}NiZr_{0.14}Mo_{0.25}O_x$, where x is an integer ranging from about 0.1 to about 50. In some embodiments, x ranges from about 1 to about 6. In other embodiments, x ranges from about 1.6 to about 5.4.

In another aspect of the present invention is the compound $Li_{3.12}NiZr_{0.15}Ta_{0.15}O_x$, where x is an integer ranging from about 0.1 to about 50. In some embodiments, x ranges from about 1 to about 6. In other embodiments, x ranges from about 1.6 to about 5.4.

In another aspect of the present invention is the compound $Li_{2.65}NiZr_{0.18}V_{0.60}O_x$, where x is an integer ranging from about 0.1 to about 50. In some embodiments, x ranges from about 1 to about 6. In other embodiments, x ranges from about 1.6 to about 5.4.

In another aspect of the present invention is an electrochromic device comprising a substrate and at least one thin film layer, wherein the thin film layer is comprised of a material selected from the group consisting of $Li_{1.82}NiW_{0.45}O_x$; $Li_{1.97}NiZr_{0.23}O_x$; $Li_{0.51}NiZr_{0.16}La_{0.19}O_x$; $Li_{2.22}NiZr_{0.14}Mo_{0.25}O_x$; and $Li_{3.12}NiZr_{0.15}Ta_{0.15}O_x$; and $Li_{2.65}NiZr_{0.18}V_{0.60}O_x$, wherein x ranges from about 0.1 to about 50. In some embodiments, x ranges from about 1 to about 6. In other embodiments, x ranges from about 1.6 to about 5.4.

In another aspect of the present invention is an electrochromic device comprising: (a) a first electrode comprising one of a electrochromic layer or a counter electrode layer, (b) a second electrode comprising other of the electrochromic layer or the counter electrode layer, (c) an ion-conductor layer for conducting ions between the first and second electrodes, (d) a first conductive layer, and (e) a second conductive layer, the first and second electrodes and the ion-conductor layer being sandwiched between the first and second conductive layers, the counter electrode layer comprises a material selected from the group consisting of $Li_{1.82}NiW_{0.45}O_x$; $Li_{1.97}NiZr_{0.23}O_x$; $Li_{0.51}NiZr_{0.16}La_{0.19}O_x$; $Li_{2.22}NiZr_{0.14}Mo_{0.25}O_x$; and $Li_{3.12}NiZr_{0.15}Ta_{0.15}O_x$; and $Li_{2.65}NiZr_{0.18}V_{0.60}O_x$, wherein x ranges from about 0.1 to about 50. In some embodiments, x ranges from about 1 to about 6. In other embodiments, x ranges from about 1.6 to about 5.4.

In another aspect, the counter electrode layer comprises $Li_{1.82}NiW_{0.45}O_x$. In another aspect, the counter electrode layer comprises $Li_{1.97}NiZr_{0.23}O_x$. In another aspect, the counter electrode layer comprises $Li_{0.51}NiZr_{0.16}La_{0.19}O_x$. In another aspect, the counter electrode layer comprises $Li_{2.22}NiZr_{0.14}Mo_{0.25}O_x$. In another aspect, the counter electrode layer comprises $Li_{3.12}NiZr_{0.15}Ta_{0.15}O_x$. In another aspect, the counter electrode layer comprises $Li_{2.65}NiZr_{0.18}V_{0.60}O_x$. In some embodiments, x ranges from about 1 to about 6. In other embodiments, x ranges from about 1.6 to about 5.4.

In another aspect of the present invention is a method for the preparation of an electrochromic device comprising: (a) providing a first conductive layer, (b) depositing one of an electrochromic layer or a counter electrode layer on the first conductive layer, thereby providing a first deposited electrode, (c) depositing an ion-conductor layer on the first deposited electrode, (d) depositing the other of the electrochromic layer or the counter electrode layer on the ion-conductor layer, thereby providing a second deposited electrode, (e) depositing a second conductive layer on the second deposited electrode, wherein the counter electrode layer comprises a material selected from the group consisting of $Li_{1.82}NiW_{0.45}O_x$; $Li_{1.97}NiZr_{0.23}O_x$; $Li_{0.51}NiZr_{0.16}La_{0.19}O_x$; $Li_{2.22}NiZr_{0.14}Mo_{0.25}O_x$; and $Li_{3.12}NiZr_{0.15}Ta_{0.15}O_x$; and $Li_{2.65}NiZr_{0.18}V_{0.60}O_x$, wherein x ranges from about 0.1 to about 50. In some embodiments, x ranges from about 1 to about 6. In other embodiments, x ranges from about 1.6 to about 5.4.

In another aspect of the present invention is an electrochromic device comprising: (a) a first electrode comprising one of a electrochromic layer or a counter electrode layer, (b) a second electrode comprising other of the electrochromic layer or the counter electrode layer, (c) an ion-conductor layer for conducting ions between the first and second electrodes, (d) a first conductive layer, and (e) a second conductive layer, the first and second electrodes and the ion-conductor layer being sandwiched between the first and second conductive layers, the counter electrode layer comprising a material having a formula $Li_aEC_1M1_bM2_cO_x$, where "EC" is an electrochromic metal species, "M1" is a host-oxide metal species, and "M2" is a dopant oxide metal species, and where "a" ranges from about 0.5 to about 3; b+c ranges from about 0.1 to about 1; c/(b+c) ranges from about 0.1 to about 0.9; and wherein x is about 0.1 to about 50. In some embodiments, x ranges from about 1 to about 6. In other embodiments, x ranges from about 1.6 to about 5.4. In another aspect, "EC" is selected from the group consisting of a mixture of Ni(II) and Ni(III); a mixture of Co(II) and Co(III); a mixture of Ir(IV) and Ir(V); and a mixture of Mn(II), Mn(III), and Mn(IV). In another aspect, "M1" is selected from the group consisting of Zr(IV); Hf(IV); Ta(V); Nb(V); and W(VI). In another aspect, "M2" is selected from the group consisting of V(V); Ta(V); Mo(VI); Nb(V); Mn(IV); La(III); or Ce(IV). In another aspect, the counter electrode layer comprises $Li_{1.82}NiW_{0.45}O_x$, wherein x ranges from about 0.1 to about 50. In some embodiments, x ranges from about 1 to about 6. In other embodiments, x ranges from about 1.6 to about 5.4. In another aspect, the counter electrode layer comprises $Li_{1.97}NiZr_{0.23}O_x$, wherein x ranges from about 0.1 to about 50. In some embodiments, x ranges from about 1 to about 6. In other embodiments, x ranges from about 1.6 to about 5.4. In another aspect, the counter electrode layer comprises $Li_{0.51}NiZr_{0.16}La_{0.19}O_x$, wherein x ranges from about 0.1 to about 50. In some embodiments, x ranges from about 1 to about 6. In other embodiments, x ranges from about 1.6 to about 5.4. In another aspect, the counter electrode layer comprises $Li_{2.22}NiZr_{0.14}Mo_{0.25}O_x$, wherein x ranges from about 0.1 to about 50. In some embodiments, x ranges from about 1 to about 6. In other embodiments, x ranges from about 1.6 to about 5.4. In another aspect, the counter electrode layer comprises $Li_{3.12}NiZr_{0.15}Ta_{0.15}O_x$, wherein x ranges from about 0.1 to about 50. In some embodiments, x ranges from about 1 to about 6. In other embodiments, x ranges from about 1.6 to about 5.4. In another aspect, the counter electrode layer comprises $Li_{2.65}NiZr_{0.18}V_{0.60}O_x$, wherein x ranges from about 0.1 to about 50. In some embodiments, x ranges from about 1 to about 6. In other embodiments, x ranges from about 1.6 to about 5.4.

In another aspect of the present invention is an insulated glazing unit comprising any of the electrochromic devices described above or herein.

In another aspect of the present invention is a method for the preparation of an electrochromic device comprising: (a) providing a first conductive layer, (b) depositing one of an electrochromic layer or a counter electrode layer on the first conductive layer, thereby providing a first deposited electrode, (c) depositing an ion-conductor layer on the first deposited electrode, (d) depositing the other of the electrochromic layer or the counter electrode layer on the ion-conductor layer, thereby providing a second deposited electrode, (e) depositing a second conductive layer on the second deposited electrode, the counter electrode layer comprising a material having a formula $Li_aEC_1M1_bM2_cO_x$, where "EC" is an electrochromic metal species, "M1" is a host-oxide metal species, and "M2" is a dopant oxide metal species, and where "a" ranges from about 0.5 to about 3; b+c ranges from about 0.1 to about 1; c/(b+c) ranges from about 0.1 to about 0.9; and wherein x is about 0.1 to about 50. In some embodiments, x ranges from about 1 to about 6. In other embodiments, x ranges from about 1.6 to about 5.4.

In another aspect of the present invention is a method for the preparation of an electrochromic device comprising: (a) providing a first conductive layer, (b) depositing one of an electrochromic layer or a counter electrode layer on the first conductive layer, thereby providing a first deposited electrode, (c) depositing an ion-conductor layer on the first deposited electrode, (d) depositing the other of the electrochromic layer or the counter electrode layer on the ion-conductor layer, thereby providing a second deposited electrode, (e) depositing a second conductive layer on the second deposited electrode, (g) performing a heat treatment step (i) after the deposition of the second deposited electrode, or (ii) after the deposition of the second conductive layer; wherein the counter electrode layer comprises a material selected from the group consisting of $Li_{1.82}NiW_{0.45}O_x$; $Li_{1.97}NiZr_{0.23}O_x$; $Li_{0.51}NiZr_{0.16}La_{0.19}O_x$; $Li_{2.22}NiZr_{0.14}Mo_{0.25}O_x$; and $Li_{3.12}NiZr_{0.15}Ta_{0.15}O_x$; and $Li_{2.65}NiZr_{0.18}V_{0.60}O_x$, wherein x ranges from about 0.1 to about 50. In some embodiments, x ranges from about 1 to about 6. In other embodiments, x ranges from about 1.6 to about 5.4.

In another aspect of the present invention is a process for producing a ternary nickel oxide material on a substrate comprising simultaneous sputter flux of a first material and a second material, wherein the first material is selected from the group consisting of lithium, nickel, zirconium, and wherein the second material is selected from the group consisting of vanadium, tantalum, niobium; and wherein the sputter flux is carried out under oxidizing conditions.

BRIEF DESCRIPTION OF THE FIGURES

FIG. 1 shows a cyclic voltammogram from cyclic voltammetry tests for $Li_{2.65}NiZr_{0.18}V_{0.60}O_x$.

FIG. 2 shows a sample of the response of % T and electrochemical current to step changes in potential, from a chronoamperometry test for $Li_{2.65}NiZr_{0.18}V_{0.60}O_x$.

FIG. 3 shows how the charge capacity for $Li_{2.65}NiZr_{0.18}V_{0.60}O_x$ increases slowly then remains constant, for an extended cyclic voltammetry test performed on the sample film.

DETAILED DESCRIPTION

Figure 4:
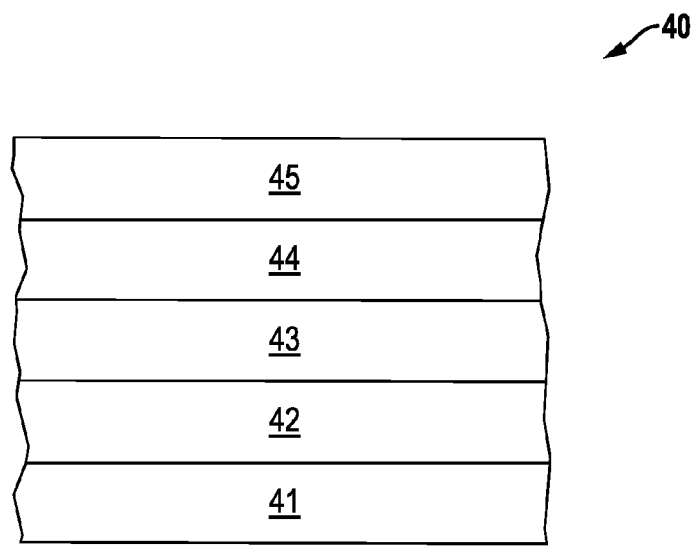
FIG. 4 includes an illustration of a cross-sectional view of a portion of an electrochromic device.

In some embodiments disclosed herein are electrochromic, lithium ion insertion materials, based solely on ternary metal oxides. The materials are known as ternary because they consist of a mixture of at least three oxides:

In some embodiments, the first oxide is nickel oxide or a similar anodic electrochromic oxide such as cobalt oxide, iron oxide, iridium oxide or manganese oxide. In some embodiments nickel oxide is used over others because of cost, electrochromic efficiency, and favorable optical absorption response.

In some embodiments, a second oxide is believed to significantly modify the structure, optical properties and electrical properties of the anodic, electrochromic oxide, and serves both as a structural host and crystal lattice dopant. In some embodiments the second oxides are zirconium oxide, hafnium oxide, tungsten oxide, and niobium oxide.

In some embodiments, the mixed oxide has the formula $Li_aEC_1M1_bM2_cO_x$, where "EC" is the electrochromic metal species, "M1" is the host-oxide metal species, and "M2" is the dopant oxide metal species, and where the subscripts "a", "1", "b", "c", and "x" denote stoichiometry, or atomic proportions.

The lithium content ($Li_a$) is defined for the as-deposited, dark state material, where all the lithium is assumed to be fully oxidized, i.e. in the Li(I) state. This does not, however, preclude the incorporation of reduced state lithium, Li(0), or its chemical analogue, for example a lithium ion, Li+ associated with an electron, when the material is reversibly, electrochemically bleached.

In some embodiments, "a" ranges from about 0.5 to about 3; b+c, which represents the total content of the host oxide species and dopant oxide metal species, ranges from about 0.1 to about 1; c/(b+c), which represents the proportion of dopant metal species to the total of the dopant and host oxide metal species, ranges from about 0.1 to about 0.9; and x, which represents the oxidation stoichiometry, satisfies the charge neutrality.

In other embodiments, "a" ranges from about 1 to about 2.6; b+c, which represents the total content of the host oxide metal species and dopant oxide metal species, ranges from about 0.2 to about 0.45; c/(b+c), which represents the proportion of dopant oxide metal species to the total of the dopant oxide metal species and host oxide metal species, ranges from about 0.55 to about 0.75; and x satisfies the charge neutrality.

In other embodiments, "a" ranges from about 1.4 to about 2.2; b+c, which represents the total content of the host oxide metal species and dopant oxide metal species, ranges from about 0.25 to about 0.35; c/(b+c), which represents the proportion of dopant oxide metal species to the total of the dopant oxide metal species and host oxide metal species, ranges from about 0.6 to about 0.7; and x satisfies the charge neutrality.

In some embodiments EC is nickel, cobalt, or manganese. In other embodiments, EC is a mixture of Ni(II) and Ni(III); a mixture of Co(II) and Co(III); a mixture of Ir(IV) and Ir(V); or a mixture of Mn(II), Mn(III), and Mn(IV). In other embodiments, EC is a mixture of Ni(II) and Ni(III); Co(II) and Co(III); or Ir(IV) and Ir(V). In yet other embodiments EC is a mixture of Ni(II) and Ni(III).

In some embodiments, the second component M1 is zirconium, hafnium, tantalum, niobium, or tungsten. In some embodiments, the second component M1 (the host-oxide metal species) is Zr(IV); Hf(IV); Ta(V); Nb(V); or W(VI). In other embodiments, M1 is Zr(IV); Hf(IV); Ta(V); or Nb(V). In yet other embodiments, M1 is Zr(IV).

In some embodiments, the third component M2 is selected from vanadium and tantalum. In some embodiments, the third component M2 (dopant oxide metal species) is V(V); Ta(V); Mo(VI); Nb(V); Mn(IV); La(III); or Ce(IV). In other embodiments, M2 is V(V); Ta(V); Mo(VI); Nb(V); or Mn(IV). In yet other embodiments, M2 is V(V) or Ta(V).

Representative materials include $Li_{1.82}NiW_{0.45}O_x$; $Li_{1.97}NiZr_{0.23}O_x$; $Li_{0.51}NiZr_{0.16}La_{0.19}O_x$; $Li_{2.22}NiZr_{0.14}Mo_{0.25}O_x$; $Li_{3.12}NiZr_{0.15}Ta_{0.15}O_x$; and $Li_{2.65}NiZr_{0.18}V_{0.60}O_x$. In each case, x ranges from about 0.1 to about 50. In some embodiments, x ranges from about 1 to about 6. In other embodiments, x ranges from about 1.6 to about 5.4. Yet other embodiments, including ranges for x, are described in Table I.

TABLE 1

Representative Materials and Amounts of Oxygen

| Composition | One embodiment for x | Low End of Range for x | High End of Range for x |
|---|---|---|---|
| $Li_{1.82}NiW_{0.45}O_x$ | 3.5 | 3 | 4.5 |
| $Li_{1.97}NiZr_{0.23}O_x$ | 2.7 | 2.2 | 3.7 |
| $Li_{0.51}NiZr_{0.16}La_{0.19}O_x$ | 2.1 | 1.6 | 3.1 |
| $Li_{2.22}NiZr_{0.14}Mo_{0.25}O_x$ | 3.4 | 2.9 | 4.4 |
| $Li_{3.12}NiZr_{0.15}Ta_{0.15}O_x$ | 3.5 | 3 | 4.5 |
| $Li_{2.65}NiZr_{0.18}V_{0.60}O_x$ | 4.4 | 3.9 | 5.4 |

Each of these materials was prepared by using a co-sputter deposition technique, as described herein. All samples were either 80 nm or 200 nm thick. Radio frequency (RF) magnetron sputtering was performed on an Angstrom EvoVac deposition system housed in a glove box under an argon atmosphere following a previously described method. Three-inch diameter metal alloy targets, Ni—Zr—X (70-15-15 at. %, where X=La, Mo, Ta, or V) and Ni—X (80-20 at. %, where X=W or Zr), were purchased from ACI Alloys, while a three-inch diameter ceramic $Li_2O$ target (99.9%) supported on a molybdenum backing plate was purchased from Plasmaterials, Inc. The gun powers for the metal alloy targets and ceramic target were about 60 W and about 45 W, respectively. The target-substrate distance was 10 cm and remained constant throughout the study, and no additional heating was applied to the substrate. The base pressure and total deposition pressure were $10^{-7}$ Torr and 2 mTorr, respectively. The $Ar/O_2$ gas mixture was fixed at ½ throughout the study.

Typically, a significant proportion of the first oxide, i.e. the electrochromic oxide, is believed to segregate to form a nanocrystalline phase, for example, NiO nanocrystals that are dispersed within a substantially amorphous mixture of the remaining oxide material. Typically, the nanocrystals are mono-disperse, i.e. fall within a narrow size range, while their size can be optimized to promote the effective internal surface or interfacial area of the material. But it is believed that the segregation is not complete, and some proportion of the second oxide, or host/dopant oxide, can dope the nanocrystals of the first oxide, in the classical sense of doping by cation substitution. Meanwhile some of the electrochromic material remains alloyed in the amorphous host material.

The general physical properties of the second oxide are those properties which at least (1) promote doping of the nanocrystal phase by cation substitution, specifically super valent doping to promote ion and electron transport; (2) promote a host oxide molecular structure that minimizes the activation energy for lithium ion diffusion, while maximizing lithium ion mobility; (3) promote the formation of a thermodynamically stable end product, or (4) yield the most desirable optical properties.

It is believed that, a third oxide further enhances the electrical and optical properties. For example, the addition of vanadium oxide surprisingly boosts the rate of switching between low and high optical transmission, presumably by boosting both the ionic and electronic conductivity of the electrode material.

In addition to the aforementioned oxides, the inventive materials also consist of a significant amount of lithium oxide and/or lithium peroxide.

By physical mechanisms that are by no means obvious, the particular compositions of ternary oxide, anodic electrochromic oxides are believed to form a complex nano-composite material that consists of doped nanocrystals dispersed within an amorphous host material that exhibits surprisingly improved electrochromic performance over the prior art. Part of the enhanced performance may result from modifications to the molecular and crystalline structure of composite oxide materials, promoting the transport of lithium ions. Part of the enhanced performance may result from aliovalent doping, or super valent doping of the nanocrystalline phase, to promote p-type semiconductor electronic conductivity. However, it has been unexpectedly found that the ternary compositions disclosed herein, in combination with specific deposition processing conditions, yield a material that appears to strike an advantageous balance between elevated ionic and elevated electronic conductivity.

It is believed that both the dimensional attributes of the doped nanocrystalline phase dispersed within amorphous matrix and the oxidation state of the component oxides and their compounds depend on the deposition process used to make the electrode material.

In general, the vacuum deposition process for growing the electrochromic counter electrode film on a planar substrate is comprised of a simultaneous, mixed, homogenous, uniform, concomitant combined flux (and/or vapor flux) of species that have been sputtered from a sputter target by energetic argon and oxygen ions. A magnetron glow discharge may serve as a source, or reservoir, or sputter ions. The species include lithium, nickel, zirconium, and a dopant metal such as vanadium, tantalum, or niobium.

The sputter flux is defined as the amount of atomic species that reach a unit area of substrate per unit time. The relative magnitude of the component parts of the sputter flux is determined to a substantial degree by the overall sputter target composition. Overall sputter target composition may consist of a collection of pure metal segments, alloy and/or oxide segments, or a finely dispersed composite of metal and/or oxide forms of all of the component species. In some embodiments, the lithium flux is generated by a separate target, or sputter source, whose voltage, current and sputter flux are separately controlled. In these embodiments, the sputter flux is combined with the flux of the remaining species to form a homogenous, uniform, resultant flux.

During the thin film deposition process, a major fraction of atoms that have been sputtered from the sputter target surface will arrive at the substrate, while a minor fraction will be lost to the interior walls and sputter shields of the sputter chamber. The loss can differ according to atomic mass, where atoms of different mass are scattered by collisions with process gas atoms and molecules to different degrees. For example, some major fraction of lithium atoms, nickel atoms, zirconium atoms, and vanadium atoms all arrive at the surface from the lithium oxide sputter target and the Ni—Zr—V alloy target. Proportionally more of the lightest element, lithium, will be lost to walls and shields. In general, the sputter target composition or element specific sputter rate can be adjusted to correct for higher loss rates, of, say, lighter atomic species. For example, more power can be applied to the separate lithium oxide sputter target for lithium. Alternatively, the composition of a target containing all of the component elements can be empirically enriched with the element(s) most prone to loss, as described above. Ultimately, the rate at which all of the remaining atoms arrive, per unit area, per unit time, can be regarded as their flux. In general, for processes in which all species stick to the growing film surface with unit probability (where all atoms stick), the relative flux of the component atomic species determines composition of the growing film. In some situations, atoms of certain species may stick with less than unit probability, or bounce off the growing film surface. In other situations, the atoms that stick to the surface may be differentially sputtered off of the surface by fast atomic neutral species from the sputter target. This is a well known phenomena for the deposition of indium tin oxide films. These, and additional effects can alter the film composition with respect to the sputter target composition, or collective sputter composition and sputter rates, yet can be corrected by enriching the target or by adjusting sputter power to separate sputter sources for certain elemental components of the film.

It is customary to report the overall rate of film growth in terms of the increase in thickness per unit time, typically in units of Ångstroms or nanometers per second.

The background partial pressure of oxygen in the sputter gas allows the atomic species that comprise the sputter flux to partially or completely form oxides, of various, mixed oxidation states. The overall degree of oxidation can be controlled by controlling the overall magnitude of the sputter flux, and the partial pressure of oxygen.

Process oxygen is provided as a separate reagent to the sputter (and/or vapor) flux, either partially or in entirety. Typically, the process oxygen is admixed into the process stream of argon sputter gas. The balance of oxygen may be provided by the oxygen content of metal oxides in the sputter source or physical vapor source material.

The sputter flux and background oxygen yield the growth of a counter electrode material, where the film growth is characterized by the spontaneous, thermodynamically driven segregation of a highly doped, substantially nano-crystalline, nickel oxide component that is dispersed in an amorphous matrix.

The nano-crystalline component of the material is characterized by larger lattice parameters than those exhibited by pure nickel(II)oxide bunsenite. The balance of the material is comprised of a substantially amorphous "host" matrix, in which the nano-crystalline component is dispersed. The amorphous matrix may be partially comprised of lithium peroxide.

In some embodiments, the chemical oxidation conditions of the process promote the formation of a substantial proportion of nickel(III) oxide in the deposited film. The balance of the nickel comprising the growing films forms nickel(II) oxide.

Bleached state spectra for the ternary materials:

At this point the bleached state transparency is at least as high as the prior art LiNiZrO material (as high as about 100% T, in-situ measurement) with depth of coloration as high as about 75%.

Charge capacities for the new ternary materials range from about 70-85 mC/cm$^2$ for layers that are approximately 150 nm to 200 nm thick.

The inventive ternary materials offer a brownish tint similar to the current materials, but color to a darker level, for the same amount of electrochemical charge insertion. This allows them to be combined more favorably with dark blue electrochromic tungsten oxide, to yield a more neutral grey dark state for the overall electrochromic coating. In other words, the inventive ternary materials offer higher electrochromic efficiency over an optical wavelength range that is complimentary to electrochromic tungsten oxide.

Moreover, the disclosed ternary materials bleach more completely than the prior art materials. The depth of coloration may potentially be better than the prior art $LiNiZrO_x$ materials but at this point their bleached state transparency is at least comparable to $LiNiZrO_x$. In fact, little or no perceptible tinting remains when the disclosed materials are in their bleached state. As a result, the level of yellowness for the overall electrochromic coating in the bleached state can be minimized or eliminated. Additionally, ternary compositions offer the possibility to improve transmission and reflectance modulation in the near infrared region of the solar radiation spectrum, hence the ternary materials are multifunctional electrochromic materials.

The disclosed materials also exhibit remarkable durability with respect to cycling between their dark and bleached states. No significant level of residual tint builds up in the bleached state with successive cycling. In other words, it is believed that the coating materials are resistant towards turning yellow over the product's (e.g. electrochromic device comprising a layer of this material) service life.

When an n-type transparent conductive oxide layer layer ("TCO") is deposited onto the p-type counter electrode layer ("CE"), in order to connect the CE to an external control circuit, the interface between the layers will typically form a heterojunction. The heterojunction may rectify electronic current, i.e. impose a barrier to electronic current in one direction, forming a diode. The heterojunction may also exhibit electronic capacitance. Both effects can limit the performance of the electrochromic film stack, by limiting the rate at which electronic charge can be supplied to (or removed from) the counter electrode through the TCO. Additional effects, both electronic and optical, may arise from the heterojunction. In general, the heterojunction effects will complicate, and very likely degrade, the operation of the electrochromic film stack. For example, an excess driving potential or control voltage may be required to surmount the heterojunction barrier, to compensate for capacitance and rectification. The excess driving potential will exert greater electrochemical stress on the electrochromic film stack, shortening its service life. The excess required potential may exceed the potential window for electrochemical reversibility, leading the irreversible side reactions that degrade product quality. Higher driving potentials will also elevate the overall electronic leakage current through defects such as pinholes.

The addition of the dopant metal oxide to the p-type counter electrode material surprisingly appears to diminish the junction barrier to electronic current between the counter electrode and the n-type TCO, obviating or diminishing the need for both an ohmic contact layer, and/or an excess driving potential.

Finally, the disclosed ternary materials switch faster than the current materials, potentially offering faster switching electrochromic coatings. This also translates into longer product lifetimes for coatings that need not be driven as hard as the current materials. It is believed that this translates into more uniform, aesthetically pleasing visual transitions on going from bleached to dark states.

As such, the materials described herein may be used in coatings for electrochromic devices, such as for electrochromic layers or counter electrode layers. FIG. 4 includes an illustration of a cross-sectional view of a portion of an electrochromic device 40 in accordance with an embodiment. The electrochromic device 40 includes a first electrode 42 comprising one of a electrochromic layer or a counter electrode layer, a second electrode 44 comprising other of the electrochromic layer or the counter electrode layer, an ion-conductor layer 43 for conducting ions between the first and second electrodes, a first conductive layer 41, and a second conductive layer 45, wherein the first and second electrodes 42 and 44 and the ion-conductor layer 43 being sandwiched between the first and second conductive layers 41 and 45. In a particular embodiment, the counter electrode layer comprises a material having a formula $Li_aEC_1M1_bM2_cO_x$, where "EC" is an electrochromic metal species, "M1" is a host-oxide metal species, and "M2" is a dopant oxide metal species, wherein "a" ranges from about 0.5 to about 3, b+c ranges from about 0.1 to about 1, c/(b+c) ranges from about 0.1 to about 0.9, and x is about 0.1 to about 50.

Structure

In some embodiments, the NiO nanocrystal size may range about 1.5 nm to about 10 nm. The lattice spacing of NiO is affected by the dopant. For example, increased lattice spacing is observed with addition of Zr and V.

Function

In order to evaluate new ternary compositions of lithium nickel metal oxides for their suitability as counter electrode layers, sample films were typically deposited onto 2 mm to 6 mm thick, transparent glass substrates that had been pre-coated with a transparent conductive oxide ("TCO") layer, typically indium tin oxide ("ITO") or fluorine doped tin oxide ("FTO"), with a sodium diffusion barrier between the glass substrate and the TCO comprised of silica or a combination of silica and tin oxide layers. Other TCO materials could also be used, for example gallium doped zinc oxide or aluminum doped zinc oxide, provided the junction formed between the TCO and counter electrode ("CE") layers does not interfere with the electrical connection or light transmission. It is also possible to use substrates other than soda lime glass, for example, fused silica, borosilicate glass, or transparent alumina wafers. The transparent substrate allows light to be transmitted through the sample as part of the evaluation of electrochromic performance, and electrochromic response to applied potential.

Representative samples thus prepared were assembled into a three electrode electrochemical cell filled with non-aqueous electrolyte, and connected to an electrochemical potentiostat. A precisely defined area of the sample film was immersed in the electrolyte, with the area defined by means of an o-ring seal, platers tape (electroplating tape) or simply the area of substrate film dipped into the liquid electrolyte. This formed the active area of working electrode. The active area was connected to the electrochemical potentiostat via the TCO layer, indium solder contact pad, copper tape with conductive silicone adhesive, an alligator clip, and finally a suitably shielded electrical lead.

In general, the body of the electrochemical cell, complete with o-ring seats for the optical ports, was machined from a block of polytetrafluoroethylene (Teflon®). Teflon® was selected for its low propensity for water uptake and permeation.

A lithium metal reference electrode and a lithium metal auxiliary/counter electrode comprised the remaining two electrodes of the three electrode cell. These were similarly connected to the electrochemical potentiostat via alligator clips and electrical leads. The lithium metal reference electrode established an electrochemical reference potential. This reference potential was crucial in that it provided a reproducible, repeatable and unambiguous means of defining the electrochemical potential applied to the sample on an absolute reference scale. It consisted of an unoxidized lithium metal surface in contact with the non-aqueous electrolyte.

The lithium metal, auxiliary/counter electrode provided an larger active surface of lithium metal, also in contact with the electrolyte. The lithium counter electrode served to supply lithium ions to or remove them from the electrolyte to balance the opposite insertion of lithium ions into the sample film or extraction of lithium ions from the sample film. In this way, the auxiliary/counter electrode completed the electrical circuit through the cell and the potentiostat. Without delving into the detailed function of the operational amplifier circuitry for the potentiostat, the auxiliary/counter electrode supplied the ionic current required to control the potential offset of the working electrode (sample film) with respect to the reference electrode.

In general, the surface of the reference electrode resided a short distance of about 1 cm or less from the surface of the working electrode, while the surface of the counter electrode resided up to about 4 cm from the working electrode.

The non-aqueous electrolyte was either purchased (BASF) or prepared from component materials by dissolving a suitable lithium salt such as lithium trifluoromethanesulfonate or lithium perchlorate into a polar, aprotic solvent such as propylene carbonate or ethylene carbonate, or mixture of propylene carbonate and ethylene carbonate. The non-aqueous electrolyte solution was kept free of contamination by water, oxygen, and nitrogen (all reactive with lithium metal) by storing it and handling it under dry argon, either in an inert atmosphere glovebox, or by using inert atmosphere techniques commonly used for synthetic chemistry of air sensitive compounds. The concentration of the electrolyte solution was about 0.7 moles per liter, selected to maximize the ionic conductivity.

The electrochemical potentiostat was capable of applying a precise and accurate electrochemical potential to the sample film. Moreover, in combination with a digital interface to a personal computer, and suitable control software, the potentiostat was able control the applied potential according to precisely defined, repeatable, and highly versatile protocols of steps, linear ramps, and sinusoidal variation with respect to time, over a wide range of potential, all with respect to the reproducible electrochemical reference potential described above.

For some measurements of electrochemical characteristics, the lithium reference electrode and the lithium counter electrode were combined, both consisting of the same piece of 1 cm×2 cm strip of lithium foil dipped into the electrolyte. In other experiments, separate lithium metal electrodes were used for the reference and counter electrode, consisting of a 3 mm diameter by 5 mm cylindrical plug of lithium metal extruded through a 5 cm length of rigid wall high density polyethylene [HDPE], or rigid nylon, 6 mm tubing. HDPE was preferred because of low its propensity for water uptake and permeation, similar to Teflon®.

Light from a diode laser or a light emitting diode was optionally shone through the entire assembly of the sample film and the three electrode cell. The light path optionally traversed an o-ring sealed window (to contain the liquid electrolyte) formed by the sample substrate itself, and then a second, uncoated glass window on the opposite side of the cell. Alternatively, the sample substrate was dipped into electrolyte between two parallel windows comprising opposite walls of the cell. Light passing through the cell was directed onto a suitable light sensor, typically an integrated circuit equipped with a photodiode and transimpedance amplifier (an operational amplifier that converts current to voltage). Light intensity was then recorded by means of sampling the amplified output that had been converted from photo-current to voltage and then connected to an analogue to digital signal acquisition circuit (ADC or DAQ) where light intensity could be recorded as a function of time, in synchrony with the current and voltage signals for the electrochemical potentiostat, and stored in a computer text file written to a hard drive. The light intensity scale was defined by setting the voltage for a reference blank cell (all cell components in the optical path, except the sample film) to 100% transmission, and the voltage with the light source (diode laser or LED) off, to 0% transmission. Care was taken not to saturate the photodiode with excessive light intensity, so that the signal linearity (proportionality between light intensity and photo signal voltage) could be assured.

A simplified optical train consisted of a red diode laser (670 nm) shining through the sample cell assembly directly onto a light sensor.

Alternatively, output from a white LED was collimated (optically refracted from a divergent cone of rays into a cylinder of parallel rays) by a commercially available achromatic doublet lens (Thorlabs), or an anastigmatic lens assembly (Viewlux Anastigmat surplus slide projector lens). The choice of these particular lenses ensured that the sample area was evenly illuminated, the beam well collimated, and the intensity throughput adequately maximized. The collimated white light was then shone through the sample cell assembly. Light transmitted through the cell was then focused (refracted from a collimated beam into a converging cone) onto the photo detector, usually with a lens assembly that matched the aperture and focal length of the one used to collimate the beam.

The combination of white LED and photo detector was optionally selected to approximate the photopic sensitivity (bright light color response) of a standard human observer.

The electrochemical range of interest for nickel oxide based electrochromic films typically spans about +1.5 Volts to about +5.0 Volts versus the potential of a lithium reference electrode in about 0.7 to about 1.0 moles per liter lithium electrolyte. At potentials near about +1.5 Volts, irreversible, electrochemical reduction reactions tend to occur. In this context, metal oxide species undergoing electrochemical reduction form lower oxides (fewer oxygen atoms per metal atom) or fully reduced metallic species. Near about +5.0 Volts, irreversible oxidation reactions tend to occur, notably the irreversible oxidation of nickel species to the about +3 and higher oxidation states, with concomitant degradation of the optical properties, for example, irreversible loss of bleached state transmission.

Well within the limits of about +1.5 Volts to about +5.0 Volts versus a lithium reference electrode, there is a range over which lithium ions can be reversibly inserted or extracted from the sample film with concomitant reduction or oxidation of the nickel species to the about +2 (bleached) or about +3 (dark)oxidation state.

Commercially available potentiostats can be programmed to automatically perform a series of electrochemical tests, to repeatedly switch sample films between lithium extracted, oxidized, dark, Ni about +3 electrochromic state and the lithium ion inserted, reduced, bleached, Ni about +2 electrochromic state. The electrochemical potential can be stepped, scanned and modulated between potential limits, precisely, accurately and repeatedly, while recording current, voltage, and the percent of transmitted light intensity.

Two test protocols used to characterize samples of ternary metal oxide counter electrode films are cyclic voltammetry and chronoamperometry.

A simplified form of chronoamperometry consists of abruptly stepping the potential applied to the sample film from an oxidizing, dark state, ion extracting potential to a reducing, bleached state, ion inserting potential, and then repeating this step cycle for hundreds of repetitions. For every step, the response of both the current and light intensity are recorded according to a sampling interval frequency several times faster than the cycle frequency. The charge capacity of the sample film, i.e. the quantity of ions, expressed as Coulombs per unit area of sample film, can be determined by numerically integrating the current with respect to time. This protocol can also gauge the rate at which the film darkens or bleaches, and the ultimate transmission levels of the dark and bleached states. Over several tens or hundreds of step cycles, this protocol indicates the stability of the sample or its propensity to fade, or diminish in capacity with cycling.

Cyclic Voltammetry is analogous to chronoamperometry except that the potential applied to the sample not stepped abruptly between potential limits, but scanned at a constant rate, say about 2 mV/s to about 200 mV/s, between potential limits. The current signal from this technique can also be numerically integrated to obtain an charge capacity, and its respective stability, but the charge capacity for cyclic voltammetry typically differs from that for chronoamperometry. In contrast to chronoamperometry, cyclic voltammetry does not yield a rate of coloration or bleaching in response to a potential step, but reveals the potential where the oxidation and reduction processes begin. The shape of the current response can also indicate whether cycling between dark and bleached states is electrochemically reversible.

When about 80 nm thick sample films of $Li_{2.65}NiZr_{0.18}V_{0.60}O_x$ were step cycled according to a chronoamperometry protocol, between potential limits of about 1.7 Volts and about 4.2 Volts versus a lithium reference electrode, the transmitted light intensity decreased from the bleached state through 90% of the maximum intensity difference, in only 11 seconds, on average. This time interval, required by the sample to change its optical transmission by 90% of its full dynamic range (measured after 2 minutes), represents the coloration time, or tc. Conversely, when the about 80 nm thick sample was stepped from about 4.2 Volts to about 1.7 Volts, starting from the fully dark state (about 4.2 Volts applied for about 2 minutes), the time interval required to bleach the sample through 90% of its full transmission range was about 11 seconds, on average. i.e. the bleaching time, tb, was approximately 11 seconds, on average. The coloration time and bleaching time provide a convenient indication of how fast the electrode sample switches between dark and bleached states and vise versa. About 11 seconds represents an improvement of approximately 5 times over previously evaluated compositions, ones that omitted the vanadium dopant oxide. Clearly, the addition of the vanadium dopant oxide surprisingly and beneficially accelerated the coloration and bleaching rates of the ternary composition. It may have done so by boosting the lithium ion conductivity and diffusivity through the bulk material, or by minimizing contact resistance or heterojunction potential at the interface between the ternary composition counter electrode layer and the TCO layer (in this case, FTO).

For about 200 nm thick films of $Li_{2.65}NiZr_{0.18}V_{0.60}O_x$ the coloration time, tc, increased to about 25 s, while the bleaching time, tb, increased to about 12 s, on average, again, where tc is the time required to "color" or decrease the optical transmission through 90% of its full range, and where Tb is the time required to "bleach" or increase the optical transmission through 90% of its full range.

The reversible lithium ion capacity for the $Li_{2.65}NiZr_{0.18}V_{0.60}O_x$ composition exhibited minimal fade of less than about 20% reduction of measured charge capacity over about 500 cycles. This reveals that the disclosed ternary compositions retain the charge capacity at least as well as the prior art binary materials.

In general, the ternary compositions, exhibited excellent electrochromic efficiency in the blue region of the visible spectrum (visible wavelength range of 420 nm to 480 nm), where the electrochromic efficiency represents the change in optical density for a corresponding quantity of charge inserted or extracted from the sample, expressed in terms of inverse units of charge per unit area. Measured values were about 30-40 $cm^2/C$ in the blue region of the visible spectrum, decreasing to less than about 20 at red wavelengths greater than 600 nm. For example, if a sample film were stepped from a bleached state holding potential of about 1.7 Volts versus of the lithium reference potential to about 4.2 Volts, then the total charge of lithium ions extracted from the sample (determined by numerically integrating the current) was typically about 40 $mC/cm^2$. The change in optically density would then be, OD=(40 $mC/cm^2$)×(45 $cm^2/C$), or OD=(0.04 $C/cm^2$)×(45 $cm^2/C$)=1.8.

EXAMPLE 1

$Li_{2.65}NiZr_{0.48}V_{0.60}O_x$ Electrode

A sample electrode of $Li_{2.65}NiZr_{0.48}V_{0.60}O_{(3.9\ to\ 5.4)}$ was deposited as follows:

A custom metal sputter target composed of 70 atm % nickel, 15 atm % zirconium and 15 atm % vanadium was purchased from ACI alloys (San Jose Calif.). The metal sputter target was loaded into a 3 inch diameter, commercially available sputter source, within a vacuum system from the same vendor (Angstrom Engineering, Kitchener, ON), alongside an identical twin sputter sputter source loaded with a lithium oxide target bonded to a molybdenum backing plate, purchased from Plasmaterials, Inc. (Livermore, Calif.). The entire sputter system was housed within an argon atmosphere glove box (M. Braun, Stratham, N.H.) equipped with a recirculating gas purifier to limit oxygen, nitrogen and water vapor levels to trace levels (<0.1 ppm) in the otherwise inert atmosphere of argon. The argon atmosphere glove box allowed the sample substrates to be loaded into the sputter system, and the substrates subsequently coated with sample films to be removed, all under an inert atmosphere of argon gas.

The soda lime substrate glass for the sample films had been pre-coated with fluorine doped tin oxide, upon a layer of silicon dioxide, upon a layer of tin oxide. These pre-coated substrates were available as Pilkington Tec Glass, specifically, Pilkington Tec 15, supplied by Hartford Glass (Hartford City, Ind.). The sheet resistance, ("Rs"), of the fluorine doped tin layer was about 15 Ohms per square. Its conductivity, σ, was approximately $2×10^3$ S/cm, or approximately 5 times less conductive than high quality indium tin oxide. Prior to sample deposition, the substrates were cleaned successively with soapy water, deionized water, acetone, isopropyl alcohol, and dried under a flowing stream of nitrogen gas.

The pre-coated substrate glass was attached using Kapton (Dupont, Wilmington, Del.) polyimide tape, with silicone adhesive, to a 15 cm×15 cm copper plate. The copper plate was then mounted onto a motorized, rotary shaft extending down from the ceiling of the vacuum chamber. The substrate faced directly down at the two sputter sources described above, at a distance of 10 cm from the sputter target. During film deposition, the copper plate and substrate were rotated to average out the composition of sputtered flux of atomic species reaching the substrate surface.

Immediately prior to sputter deposition, the vacuum chamber that housed the sputter sources was pumped down first to rough vacuum by mechanical vacuum pumps, and then down to a high vacuum base pressure of <$1 \times 10^{-7}$ Torr by means of a helium cryo-pump (Cryo-torr 8F, CTI Cryogenics). Pumping the chamber down to this based pressure ensured that the process was not contaminated by air or water leaks or from gaseous species outgassing from components within the vacuum chamber.

For sputter deposition, a mixture of argon and oxygen sputter gas was admitted into the vacuum chamber at a volumetric flow rate ratio of 1 to 2 for Argon to Oxygen. The total flow rate was increased while the pumping port leading to the cryo-pump was throttled, to achieve a constant sputter pressure of about 2 milliTorr. Radio frequency (rf) power was supplied to the sputter targets at a frequency of about 13.56 MHz. About 60 Watts of rf power was supplied to the sputter source with the nickel-zirconium-vanadium sputter target, to sustain a target power density (applied power divided by total target area) of about 1.1 Watts per $cm^2$, while about 45 Watts of rf power was supplied to the sputter source with the lithium oxide ceramic sputter target, to sustain a target power of about 0.83 Watts per $cm^2$. These sputter conditions yielded a sample film growth rate (or deposition rate) of about 0.04 Ångstroms per second.

After achieving a sample film thickness of 2000 Ångstroms, the resulting sample film was removed and sectioned into 1 cm×2 cm slides for further characterization by electrochemical cyclic voltammetry and chronoamperometry, and for spectrophotometric characterization.

Serial deposition runs were also conducted to deposit sample films onto vacuum grade aluminum foil, for elemental analysis by inductively coupled plasma mass spectrometry [ICP-MS]. Prior to ICP-MS analysis, the entire aluminum foil substrate and sample film were completely dissolved in ultrapure, semiconductor grade hydrochloric acid. Samples films were also deposited onto uncoated soda lime microscope slides for x-ray diffraction analysis of crystal structure, and Hall parameter determination (mobility, carrier density, and conductivity).

X-ray diffraction analysis revealed that the sample films contained nickel oxide nanocrystals with a characteristic size of 3.5 nm (35 Ångstoms in diameter).

Elemental analysis by ICP-MS revealed that the relative atomic metals composition was about 2.65:1.00:0.18:0.60 for lithium:nickel:zirconium:vanadium.

The Hall effect, four point probe measurements, using the Van der Pau electrode configuration, revealed that the electronic conductivity of the sample films was $(3.0+/-0.3) \times 10^{-3}$ S/cm; mobility, $(1.6+/-1.4) \times 10^2$ $cm^2/Vs$; carrier density, $(4+/-4) \times 10^{14}$ $cm^{-3}$.

Electrochemical tests were performed on 1 cm×1 cm sample films immersed in Novolyte electrolyte (BASF) composed of 1.0 moles per liter lithium perchlorate in propylene carbonate.

When subjected to cyclic voltammetry, scan-cycling at about 20 milliVolts per second between about 1.7 Volts to about 4.2 Volts versus a lithium reference electrode, the sample films showed excellent reversibility: films (80 and 200 nm thick) exhibited less than 20% fade in charge capacity after 500 scan-cycles from 1.7 to 4.2 and back to 1.7 Volts.

Chronoamperometry tests subjected the sample films to abrupt, repeating steps in electrochemical potential from 1.7 Volts to 4.2 Volts (coloration step) and 4.2 Volts to 1.7 Volts (bleaching step) with a 2 minute time interval between steps. About 80 nm thick samples exhibited a repeatable bleaching time of about tb=11 seconds (to switch from fully dark to 90% bleached), and a coloration time of about tc=11 seconds with corresponding bleached and dark state for light transmission at 670 nm of Tb=98% and about Tc=50%, where the transmission of an uncoated Tec 15 substrate served as a reference blank for 100% transmission. 200 nm thick films exhibited corresponding values of about tc=25 seconds, about tb=12 seconds, about Tb=94% and about Tc=26%.

EXAMPLE 2

$Li_{1.97}NiZr_{0.23}O_x$ Electrode

Preparation of $Li_{1.97}NiZr_{0.23}O_x$ electrode samples was exactly analogous to that for $Li_{2.65}NiZr_{0.18}V_{0.60}Ox$ except that the metal sputter target composition was 80 atm % nickel and 20 atm % zirconium.

X-ray diffraction analysis revealed that the sample films contained nickel oxide nanocrystals with a characteristic size of 3.4 nm (34 Ångstoms in diameter).

Elemental analysis by ICP-MS revealed that the relative atomic metals composition was 1.97:1.00:0.23 for lithium:nickel:zirconium.

Hall effect, four point probe measurements, using the Van der Pau electrode configuration, revealed that the electronic conductivity of the sample films was $(3.0+/-0.3) \times 10^{-2}$ S/cm; mobility, $(2.0+/-1.6) \times 10^2$ $cm^2/Vs$; carrier density, $(2+/-2) \times 10^{15}$ $cm^{-3}$.

The sample films showed excellent reversibility through cyclic voltammetry: films (about 80 and about 200 nm thick) exhibited less than about 20% fade in charge capacity after 500 scan-cycles from 1.7 to 4.2 and back to 1.7 Volts.

Chronoamperometry tests revealed that about 80 nm thick samples exhibited a repeatable bleaching time of tb=18 seconds (to switch from fully dark to about 90% bleached), and a coloration time of about tc=20 seconds with corresponding bleached and dark state for light transmission at about 670 nm of about Tb=98% and about Tc=50%. About 200 nm thick films exhibited corresponding values of about tc=41 seconds, about tb=19 seconds, about Tb=98% and about Tc=28%.

What is claimed is:

1. A compound having a formula $Li_aEC_1M1_bM2_cO_x$, wherein "a" ranges from about 0.5 to about 3; b+c ranges from about 0.1 to about 1; c/(b+c) ranges from about 0.1 to about 0.9; and wherein x is about 0.1 to about 50;
   wherein "EC" is selected from the group consisting of a mixture of Ni(II) and Ni(III); a mixture of Co(II) and Co(III); a mixture of Ir(IV) and Ir(V); and a mixture of Mn(II), Mn(III), and Mn(IV);
   "M1" is selected from the group consisting of Zr(IV); Hf(IV); Ta(V); Nb(V); and W(VI); and
   "M2" is selected from the group consisting of V(V); Ta(V); Mo(VI); Nb(V); Mn(IV); La(III); and Ce(IV).

2. The compound of claim 1, where x is an integer ranging from about 0.1 to about 50.

3. The compound of claim 1, where x is an integer ranging from about 1 to about 6.

4. The compound of claim 1, where "a" ranges from about 1 to about 2.6.

5. The compound of claim 1, where b+c ranges from about 0.2 to about 0.45.

6. The compound of claim 1, where c/(b+c) ranges from about 0.55 to about 0.75.

7. The compound of claim 1, where:
"a" ranges from about 1.4 to about 2.2;
b+c ranges from about 0.25 to about 0.35; and
c/(b+c) ranges from about 0.6 to about 0.7.

8. An electrochromic device comprising:
(a) a first electrode comprising one of a electrochromic layer or a counter electrode layer,
(b) a second electrode comprising other of the electrochromic layer or the counter electrode layer,
(c) an ion-conductor layer for conducting ions between the first and second electrodes,
(d) a first conductive layer, and
(e) a second conductive layer,
the first and second electrodes and the ion-conductor layer being sandwiched between the first and second conductive layers,
the counter electrode layer comprising a material having a formula $Li_aEC1M1_bM2_cO_x$, where
"EC" is an electrochromic metal species,
"M1" is a host-oxide metal species, and
"M2" is a dopant oxide metal species, and
"a" ranges from about 0.5 to about 3; b+c ranges from about 0.1 to about 1; c/(b+c) ranges from about 0.1 to about 0.9; and wherein x is about 0.1 to about 50.

9. The electrochromic device of claim 8, wherein "EC" is selected from the group consisting of a mixture of Ni(II) and Ni(III); a mixture of Co(II) and Co(III); a mixture of Ir(IV) and Ir(V); and a mixture of Mn(II), Mn(III), and Mn(IV).

10. The electrochromic device of claim 8, wherein "M1" is selected from the group consisting of Zr(IV); Hf(IV); Ta(V); Nb(V); and W(VI).

11. The electrochromic device of claim 8, wherein "M2" is selected from the group consisting of V(V); Ta(V); Mo(VI); Nb(V); Mn(IV); La(III); or Ce(IV).

12. The device of claim 8, wherein the counter electrode layer comprises $Li_{1.82}NiW_{0.45}O_x$, and wherein x ranges from about 0.1 to about 50.

13. The device of claim 8, wherein the counter electrode layer comprises $Li_{1.97}NiZr_{0.23}O_x$, and wherein x ranges from about 0.1 to about 50.

14. The device of claim 8, wherein the counter electrode layer comprises $Li_{0.51}NiZr_{0.16}La_{0.19}O_x$, and wherein x ranges from about 0.1 to about 50.

15. The device of claim 8, wherein the counter electrode layer comprises $Li_{2.22}NiZr_{0.14}Mo_{0.25}O_x$, and wherein x ranges from about 0.1 to about 50.

16. The device of claim 8, wherein the counter electrode layer comprises $Li_{3.12}NiZr_{0.15}Ta_{0.15}O_x$, and wherein x ranges from about 0.1 to about 50.

17. The device of claim 8, wherein the counter electrode layer comprises $Li_{2.65}NiZr_{0.18}V_{0.60}O_x$, and wherein x ranges from about 0.1 to about 50.

18. An electrochromic device comprising a substrate and at least one thin film layer, wherein the thin film layer is comprised of a material selected from the group consisting of $Li_{1.82}NiW_{0.45}O_x$; $Li_{1.97}NiZr_{0.23}O_x$; $Li_{0.51}NiZr_{0.16}La_{0.19}O_x$; $Li_{2.22}NiZr_{0.14}Mo_{0.25}O_x$; $Li_{3.12}NiZr_{0.15}Ta_{0.15}O_x$; and $Li_{2.65}NiZr_{0.18}V_{0.60}O_x$, wherein x ranges from about 0.1 to about 50.

19. The electrochromic device of claim 18, wherein x ranges from about 1 to about 6.

20. The electrochromic device of claim 18, wherein x ranges from about 1.6 to about 5.4.

* * * * *

UNITED STATES PATENT AND TRADEMARK OFFICE
CERTIFICATE OF CORRECTION

| | | |
|---|---|---|
| PATENT NO. | : 8,995,041 B2 | Page 1 of 1 |
| APPLICATION NO. | : 13/961184 | |
| DATED | : March 31, 2015 | |
| INVENTOR(S) | : Douglas Glenn John Weir et al. | |

It is certified that error appears in the above-identified patent and that said Letters Patent is hereby corrected as shown below:

Claims

Column 17, line 8, claim 8, please delete "of a electrochromic" and insert --of an electrochromic--

Column 17, line 20, claim 8, please delete "EC1" and insert --$EC_1$--

Signed and Sealed this
Twenty-third Day of February, 2016

Michelle K. Lee
*Director of the United States Patent and Trademark Office*